(12) United States Patent
Stanton (10) Patent No.: US 6,376,130 B1
(45) Date of Patent: Apr. 23, 2002

(54) CHROMELESS ALTERNATING RETICLE FOR PRODUCING SEMICONDUCTOR DEVICE FEATURES

(75) Inventor: William Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/510,359

(22) Filed: Feb. 22, 2000

(51) Int. Cl.$^7$ ............................. G03F 9/00; G03C 5/00
(52) U.S. Cl. ........................................... 430/5; 430/322
(58) Field of Search ........................... 430/5, 322, 323, 430/324; 438/381, 396; 716/19, 21

(56) References Cited

U.S. PATENT DOCUMENTS

| | | | |
|---|---|---|---|
| 5,049,925 A | 9/1991 | Aiton et al. | 355/53 |
| 5,322,438 A | 6/1994 | McNutt et al. | 437/51 |
| 5,429,897 A | 7/1995 | Yoshioka et al. | |
| 5,477,058 A | 12/1995 | Sato | 250/548 |
| 5,487,962 A | 1/1996 | Rolfson | 430/5 |
| 5,533,634 A | 7/1996 | Pan et al. | |
| 5,635,421 A | 6/1997 | Ting | 438/396 |
| 5,712,063 A * | 1/1998 | Ahn et al. | 430/5 |
| 5,876,878 A | 3/1999 | Pierrat et al. | 430/5 |
| 5,882,827 A | 3/1999 | Nakao | 430/5 |
| 5,897,975 A | 4/1999 | Ahn et al. | |
| 5,925,921 A | 7/1999 | Susak | 257/532 |
| 5,935,736 A | 8/1999 | Tzu | |
| 6,010,807 A | 1/2000 | Lin | |

FOREIGN PATENT DOCUMENTS

| | | |
|---|---|---|
| DE | 195 27 681 A1 | 2/1996 |
| EP | 0 464 492 A1 | 1/1992 |

OTHER PUBLICATIONS

Patent Abstracts of Japan, vol. 017, No. 688 (P–1662), Dec. 16, 1993 & JP 05 232681 A (Matsushita Electron Corp.), Sep. 10, 1993 abstract.
Patent Abstracts of Japan, vol. 1996, No. 10, Oct. 31, 1996 & JP 08 152706 A (Fujitsu Ltd), Jun.11, 1996 abstract.
International Search Report dated Oct. 15, 2001.

* cited by examiner

Primary Examiner—S. Rosasco
(74) Attorney, Agent, or Firm—Dickstein Shapiro Morin & Oshinsky LLP (57) ABSTRACT

An alternating phase shift reticle for a capacitor layout scheme for a memory device and a method for its fabrication is disclosed. The alternating phase shift mask has regions of 0 and 180 degree phase shifts arranged in a way such that all sides of each region corresponding to a given phase shift value are bounded by areas corresponding to an opposite phase shift value. The reticle can be used to produce densely packed capacitor features, in which the variance between the actual exposure pattern and the desired exposure pattern is reduced.

15 Claims, 6 Drawing Sheets

CHROMELESS ALTERNATING RETICLE FOR PRODUCING SEMICONDUCTOR DEVICE FEATURES

FIELD OF THE INVENTION

The present invention relates to a photolithography reticle for use in manufacturing semiconductor devices, and more particularly to a reticle and method of making it, which can be used to sharpen the light used to expose a masking material and thereby improve the definition of fabricated features.

BACKGROUND OF THE INVENTION

Photolithography is commonly used in semiconductor device fabrication to pattern various photomasks used in processing a wafer. A layer of resist is deposited on the wafer and exposed using an exposure tool and template such as a mask or reticle. During the exposure process, radiant energy, such as ultraviolet light, is directed through the reticle to selectively expose the resist in a desired pattern. The resist is then developed to remove either the exposed portions for a positive resist or the unexposed portions for a negative resist, forming thereafter a resist mask on the wafer. The resist mask can be used further to protect underlying areas of the wafer during subsequent fabrication processes, such as deposition, etching, or ion implantation processes.

An integral component of the photolithographic process is the reticle. The reticle includes the pattern for passing, blocking, or phase shifting light to expose the photoresist which is used to form features (e.g., transistor or capacitor structures) at a particular layer of a semiconductor device. The reticle is typically a quartz plate coated with a patterned light blocking material such as, for example, chromium. This type of mask is typically called a binary mask because light is completely blocked by the light blocking material and fully transmitted through the unblocked quartz portions.

Binary masks pose various problems when fabricating dense circuits. Light passing through the edge of a pattern within the mask (e.g., the boundary between a light blocking region and a transparent region) is oftentimes diffracted. This means that instead of producing a very sharp image of the edge on the resist layer, some lower intensity light diffracts beyond the intended edge boundary and into the regions expected to remain dark. Hence, the resultant feature shapes and sizes deviate somewhat from the intended IC design. Because integrated circuit manufacturers have continued to reduce the geometric size of the IC features, this diffraction can produce wafers having dies with incomplete or erroneous circuit patterns.

Attenuated phase shift masks (PSMs) have been used to overcome the diffraction effects and to improve the resolution and depth of focus of images projected onto a target (i.e., the photoresist). Attenuated PSMs utilize partially transmissive regions in addition to the light blocking and light transmissive regions used in binary masks. The partially transmissive regions typically pass (i.e., do not block) about three to eight percent of the light they receive. Moreover, the partially transmissive regions are designed so that the light they do pass is shifted by 180 degrees in comparison to the light passing through the transparent (e.g., transmissive) regions. Thus, some of the light spreading outside of the transparent region defined by the PSM pattern edge destructively interferes with light passing from the partially transmissive regions. This way, the detrimental effects caused by diffraction can be controlled.

Figure 1:
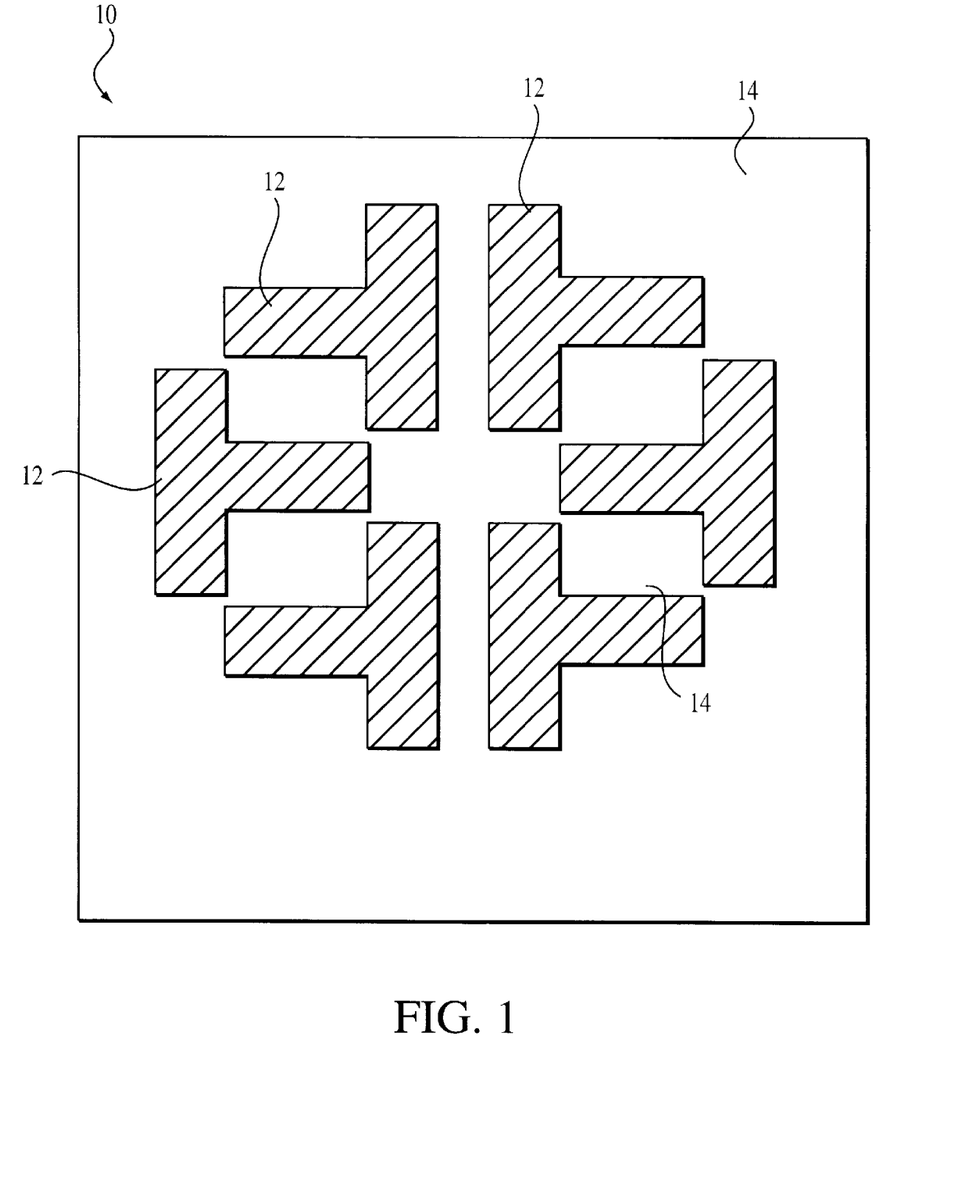
FIG. 1 illustrates an aerial image of a conventional attenuated phase shift reticle for fabricating capacitor container wells.

As it is known in the art, reticle layouts are generated for each photoresist layer that must be patterned. Each reticle layout includes a pattern for blocking/passing light which is designed to produce, through the exposed photoresist, corresponding circuit features. One such representative reticle is shown in FIG. 1. This reticle is a 0–180 degree attenuated phase shift reticle used to produce patterned areas for etching an insulated layer, e.g. a BPSG layer, to produce wells for fabricating container capacitors. Portions of an original reticle layout have been modified by OPC (optical proximity correction) techniques to generate a modified layout so that if exposure were directed through a reticle having such a modified layout, the photoresist would be exposed in a pattern which includes features which more closely approximates the corresponding desired feature in a circuit layout. The modified layout may be generated using any known algorithms or by other techniques, for instance, using trial and error through experience with particular layouts.

An attenuated phase shift mask which has different regions of differing phase shift values may be made in a variety of ways. For example, the 0–180 degree phase shift mask, illustrated in FIG. 1, can be made by taking a substrate of a transparent material, such as quartz, having a thickness such that incident light passing through the layer is of the same phase as the light entering the layer (0 degree phase shift), and etching into the side of the quartz layer where light exits to a depth which will shift the phase of incident exposure by 180 degrees (relative to the 0 degree regions, i.e., the regions of the layer which are not etched) to produce the 180 degree phase shift regions. A chrome layer is also applied on the light entering side to block these portions of the quartz substrate where incident light should not pass through the substrate and a layer of partially transmissive material is also applied on the quartz layer at the light entry side, over the etched regions, to form the partially transmissive 180 degree phase shift regions.

This way, transmissive or transparent regions 12 of open quartz, the partially transmissive regions 14, and the blocked regions combine to form a light pattern in a photoresist layer. The transparent regions 12 pass the light without a phase shift. The partially transmissive regions 14 pass only about six percent of the light they receive with a 180 degree phase shift. The material used to form the partially transmissive regions 14 is any suitable opaque material, for example, molybdenum silicide (Mo—Si) or chromium fluoride. A preferred material for use in making the transparent regions 12 of reticle 10 is quartz. However, any other suitable light transmissive material such as soda-lime glass, borosilicate glass, or other similar natural or synthetic materials can be used also. Light blocking regions are typically formed with a chrome layer on the quartz substrate.

Figure 2:
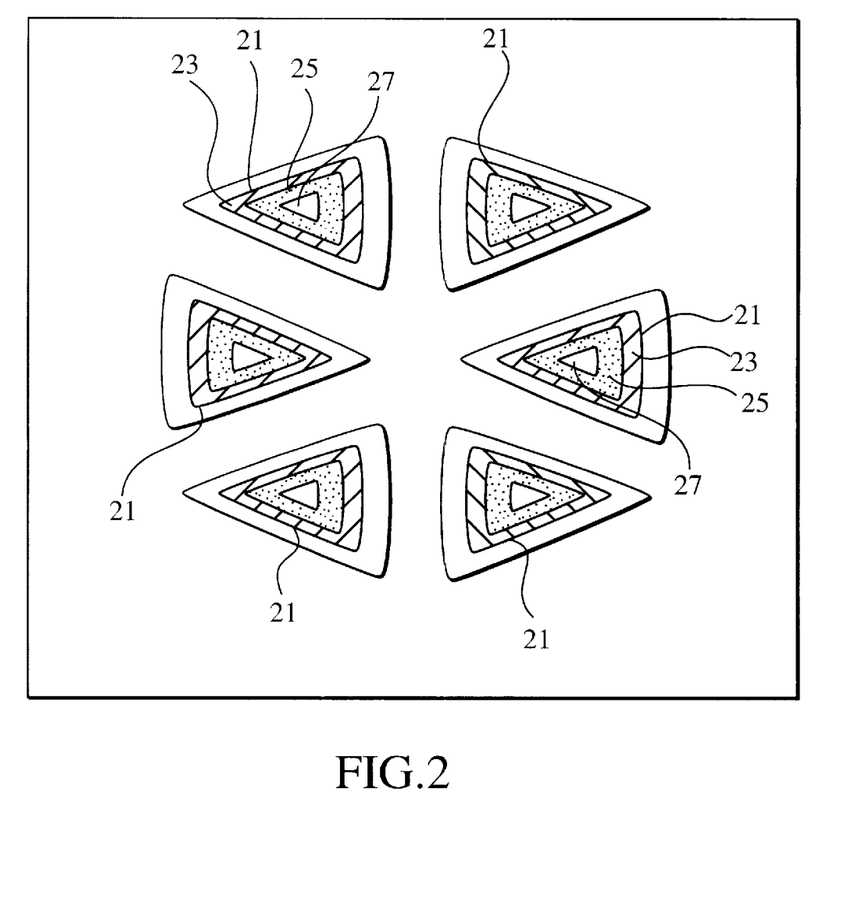
FIG. 2 illustrates the aerial light intensity image contours produced by the reticle layout of FIG. 1.

Although the FIG. 1 attenuated phase shift reticle is adequate for many applications, as semiconductors sizes continue to decrease, the light pattern produced by it becomes an increasing problem. FIG. 2 is the aerial image response with a critical dimension contour (CD) of the printing image of a capacitor design formed with the attenuated phase shift reticle layout of FIG. 1. FIG. 2 depicts different regions which correspond to different light intensities which are produced by the FIG. 1 reticle. The contour of the desired printing image is delineated by line 21. When exposed in a positive photoresist, the area encapsulated within line 21 of FIG. 2, that is the area including zones 23, 25, and 27, is removed and an etch opening is formed in a photoresist. Unfortunately, the light intensity contours of adjacent areas in FIG. 2, such as regions 23 and 25 for example, are not sharply defined since at sub-micron levels, light is diffracted and affected by proximity effects.

Accordingly, there is a blurring of light, or stated otherwise, a light transition region across the boundaries of the defined intensity regions 23, 25, and 27.

Proximity effects occur primarily when very closely spaced circuit pattern features are lithographically transferred to a resist layer on a wafer. The light waves of the closely spaced circuit features interact, thereby distorting the final transferred pattern features. Accordingly, features that are in close proximity to other features tend to be more significantly distorted than features which are relatively isolated from other features.

As a consequence of the unsharp profiles in light intensity from one region to the next, the edges of the developed photoresist pattern tend to be less well defined in these areas than in other areas of the masked pattern. In small, dense integrated circuits, such as VLSI, these blurred images can cause printing of features which may significantly degrade a circuit's performance, since the correspondence between the actual circuit design and the final transferred circuit pattern on the photoresist layer is decreased. Further, unsharp profiles can result in a loss of wafer surface area, which correspondingly reduces the total area available for deposited conductors and accordingly results in undesirable increase in contact resistance.

Accordingly, there is a need for a simplified phase shift reticle which can be used to precisely fabricate small circuit features, for example, closely spaced wells for container capacitors used in a memory circuit.

SUMMARY OF THE INVENTION

The present invention provides an alternating phase shift mask for a capacitor layout scheme for a memory device integrated circuit. The alternating phase shift mask has regions of 0 and 180 degree phase shifts arranged in a way such that all sides of each region corresponding to a given phase shift value are bounded by areas corresponding to an opposite phase shift value.

The present invention also provides a method for producing an alternating phase shift reticle having regions of 0 and 180 degree phase shifts arranged in a way such that all sides of each region corresponding to a given phase shift value are bounded by areas corresponding to an opposite phase shift value. The reticle can be used to produce densely packed capacitor features, in which the variance between the actual exposure pattern and the desired exposure pattern is reduced. The alternating phase shift reticle of the present invention counteracts the diffraction and proximal effects, while improving both the resolution and depth of focus of the transmitted light.

Additional advantages and features of the present invention will become more readily apparent from the following detailed description of the invention, which is provided in connection with accompanying drawings.

DETAILED DESCRIPTION OF THE PREFERRED EMBODIMENT

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or on the base semiconductor structure or foundation. In addition, the semiconductor need not be silicon-based, but could be based on silicon-germanium, germanium, or gallium arsenide.

Figure 3:
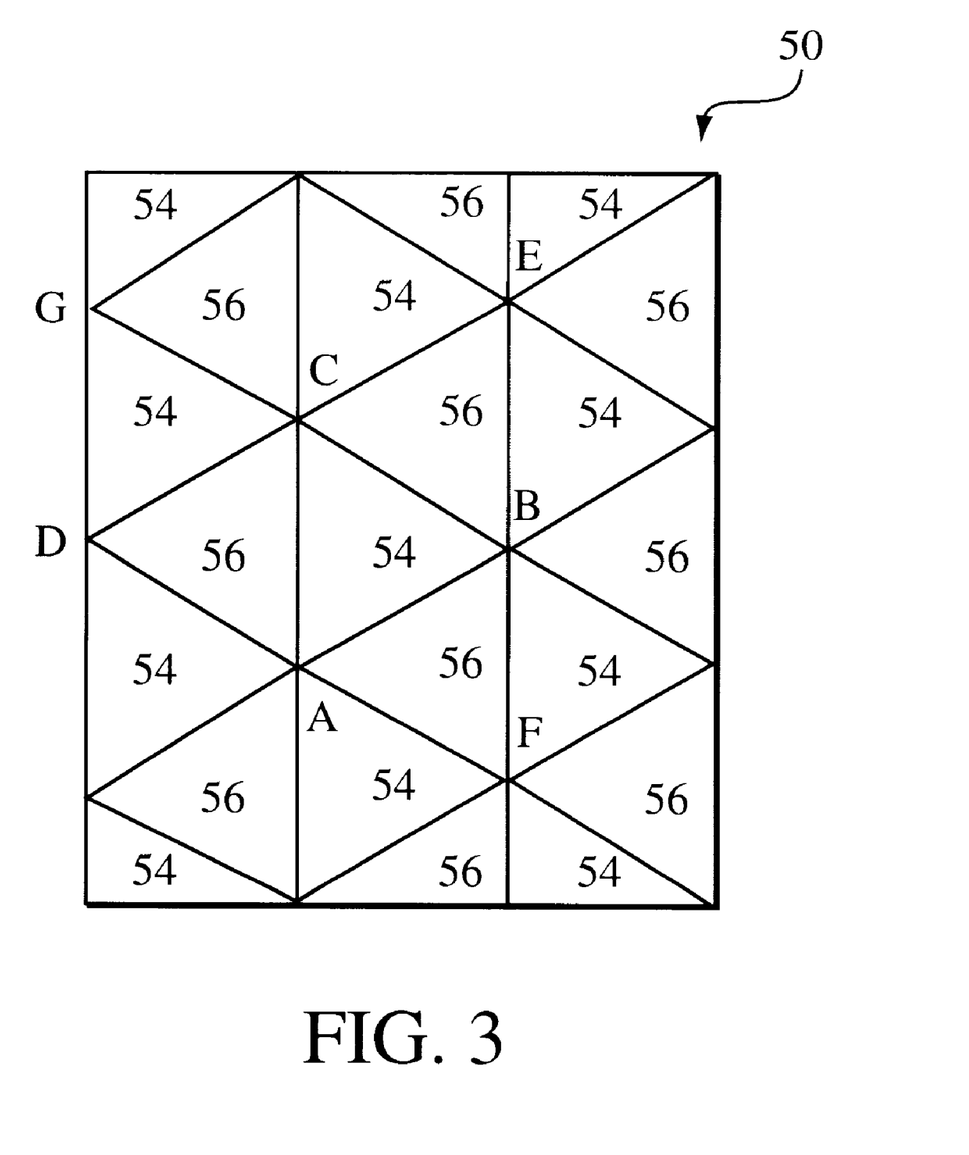
FIG. 3 illustrates an alternating phase shift mask constructed in accordance with the invention.

Referring now to the drawings, where like elements are designated by like reference numerals, FIG. 3 illustrates a portion of an alternating phase shift reticle according to a preferred embodiment of the present invention, which is adapted to form a layout or design for container capacitors in a memory device, e.g. a DRAM, at a particular level of fabrication.

Referring to FIG. 3, the phase shift reticle 50 includes a transparent substrate 52 (FIGS. 5–8) made of quartz or glass. The transparent substrate 52 is partitioned into a plurality of triangular regions, spaced apart in a predetermined ordered, and arranged in a matrix array in a way to define 0-degree phase shift regions 54 and 180-degree phase shift regions 56. Each of the 0-degree phase shift regions is bounded on all sides by 180-degree phase shift regions. Similarly, each of the 180-degree phase shift regions is bounded on all sides by 0-degree phase shift regions.

For example, as illustrated in FIG. 3, 0-degree phase shift area ABC is completely bounded by three 180-degree phase shift areas, identified as CAD, ABF, and CBE, respectively. In turn, 180-degree phase shift area CDA is completely bounded by three 0-degree phase shift areas, which are identified as ABC, CDG, and ADH, respectively.

Figure 4:
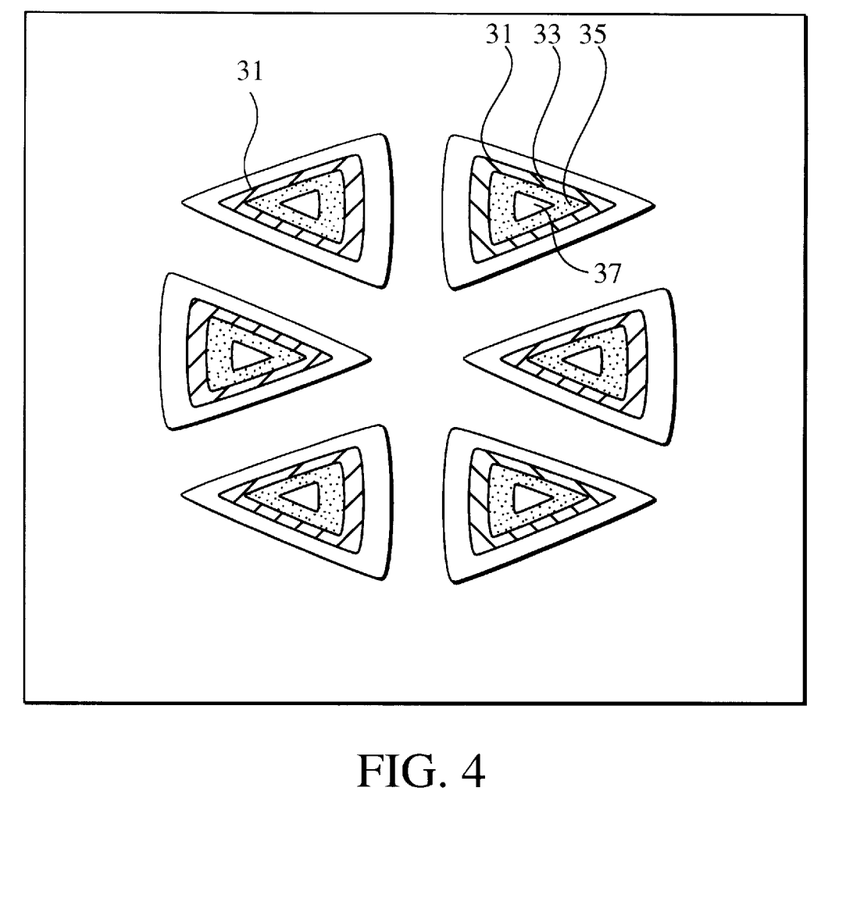
FIG. 4 illustrates the aerial light intensity image contours produced by the reticle layout of FIG. 3.

FIG. 4 illustrates the aerial light intensity image response of the alternating phase shift reticle of the present invention, shown in FIG. 3. The contour of the printing image is delineated by line 31. Similar to the aerial image response of the prior art, which was shown in FIG. 2, regions 33, 35, and 37 of FIG. 4 define the areas that will subsequently be removed to form a well or hole for a capacitor layout.

A comparison between the light intensity contours of FIG. 2 and those of FIG. 4 reveals an increased and sharper contrast between different zone areas corresponding to different light intensities, such as for example zones 25 and 35. The edges and corners of the pattern of FIG. 4 are also more sharply defined than those of the pattern corresponding to FIG. 2. Thus, the rounding effects that characterized the FIG. 1 reticle are less pronounced when using the reticle of the present invention. Accordingly, the reticle of the invention provides an improved correspondence between the original circuit design and the pattern transferred to the photoresist, affords a more reliable print of smaller and more densely packed IC features, and provides a wider latitude for reticle misalignment.

The present invention provides an alternating phase shift mask with 0-degree phase shift regions bounded all around by 180-degree phase shift regions, and with 180-degree phase shift regions bounded all around by 0-degree phase shift regions. Although the present invention has been described with reference to triangular alternating phase shift regions, it is to be understood that modifications can be made to the invention and equivalents substituted for described and illustrated structures without departing from the spirit and scope of the invention. For example, the alternating phase shift regions may have a rectangular or other suitable shape, as long as the sides of all 0-degree phase shift areas are bounded by 180-degree areas and all sides of 180-degree phase shift areas are bounded by 0-degree phase shift areas.

Figure 5:
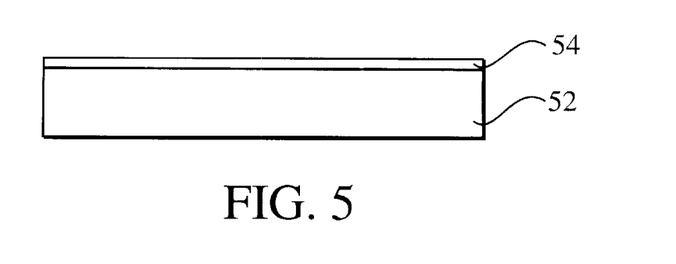
FIG. 5 illustrates a reticle undergoing an intermediate stage of processing according to the present invention.

The method for fabricating a reticle according to the present invention will now be described with reference to FIGS. 5–11. Reference is first made to FIG. 5. A material layer 54 is deposited over a reticle transparent substrate 52, the latter of which may be formed of silica glass, fused quartz glass, borosilicate glass or another material transparent to various types of radiation commonly used in semiconductor lithographic operations, by any conventional method. Material layer 54 may be either a partially light transmissive layer or an opaque layer, depending on other features which are to be created using the reticle, a portion of which is illustrated in FIGS. 5–11. For a partially light transmissive layer, layer 54 may be an attenuating material such as a molybdenum suicide. For an opaque layer, layer 54 may use materials such as chrome, aluminum, iron oxide, gold, or tungsten, to name just a few. Since chrome is most widely used, and for simplification of the method steps, reference will be made hereinafter to layer 54 as being chrome layer 54. However, it should be understood that those skilled in the art will recognize that a light transmissive material could also form layer 54.

Layer 54 of FIG. 5 may be deposited onto transparent substrate 52 by conventional processes such as sputtering, chemical vapor deposition (CVD) or electron beam deposition (EBD).

Figure 6:
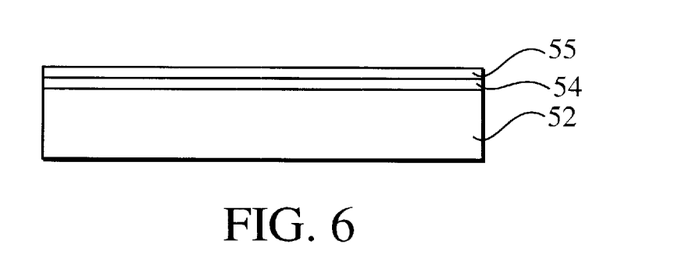
FIG. 6 illustrates a reticle undergoing an intermediate stage of processing according to the present invention at a point subsequent to that shown in FIG. 5.

Next, as shown in FIG. 6, a pattern layer 55 is then deposited over chrome layer 54. Pattern layer 55 may be made of any material used to transfer a pattern to a subsequent layer and will depend upon the radiation characteristics of the equipment used in subsequent steps. For example, where an electron beam direct write system is used, pattern layer 55 will be formed of an electron beam sensitive photoresist. Alternatively, where an optical system is used to generate radiation of a particular wavelength, pattern layer 55 will be a conventional photoresist material.

Figure 7:
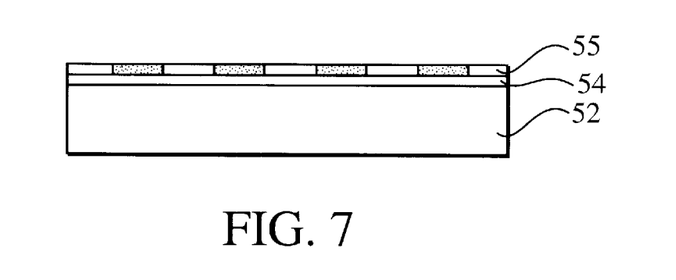
FIG. 7 illustrates a reticle undergoing an intermediate stage of processing according to the present invention at a point subsequent to that shown in FIG. 6.

Reference is now made to FIG. 7. After preparing reticle substrate 52 with chrome layer 54 and pattern layer 55, pattern layer 55 is exposed to radiation by a scanning electron beam or light, such as from a laser. Radiation emerging from a radiation source is imaged onto pattern layer 55. The imaging process results in the transfer of 180-degree phase shift region pattern to pattern layer 55. This way, the 180-degree region pattern is exposed. This step in the fabrication process, at which 180-degree regions are patterned, is referred to in the art as the "first write."

The pattern layer 55 is written with an electron beam direct write system and the 180-degree region pattern is developed to arrive at the structure illustrated in FIG. 7. As mentioned before, while the transfer of pattern will typically use an electron beam direct write system, it is also possible to perform pattern transfer using an optical imaging process using radiation having a wavelength ranging from the deep-UV to about 200 nanometers to optical wavelengths up to about 440 nanometers.

Figure 8:
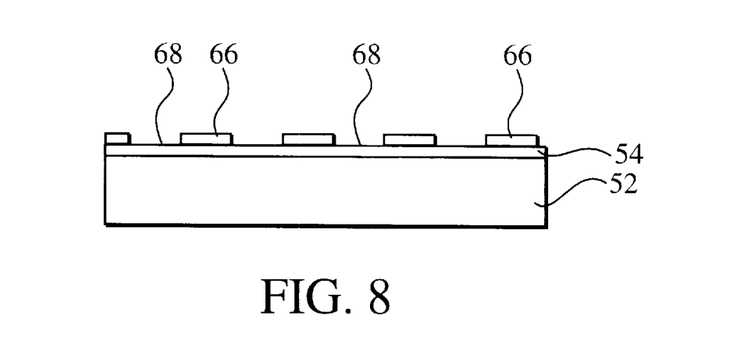
FIG. 8 illustrates a reticle undergoing an intermediate stage of processing according to the present invention at a point subsequent to that shown in FIG. 7.

Reference is now made to FIG. 8. After preparing reticle substrate 52 with chrome layer 54 and pattern layer 55, the pattern layer 55 is then developed to obtain areas 68 (future 180-degree regions) on reticle substrate 52 and chrome layer 54. As shown in FIG. 8, areas 66 (future 0-degree regions) have portions of pattern layer 55 on them, while areas 68 (future 180-degrees regions) have only chrome on them, from chrome layer 54.

Figure 9:
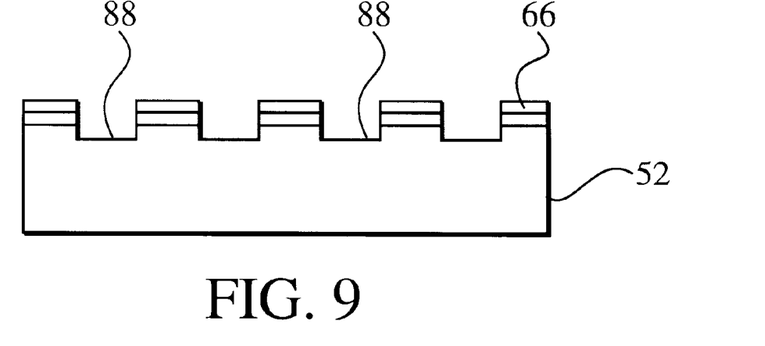
FIG. 9 illustrates a reticle undergoing an intermediate stage of processing according to the present invention at a point subsequent to that shown in FIG. 8.
Figure 10:
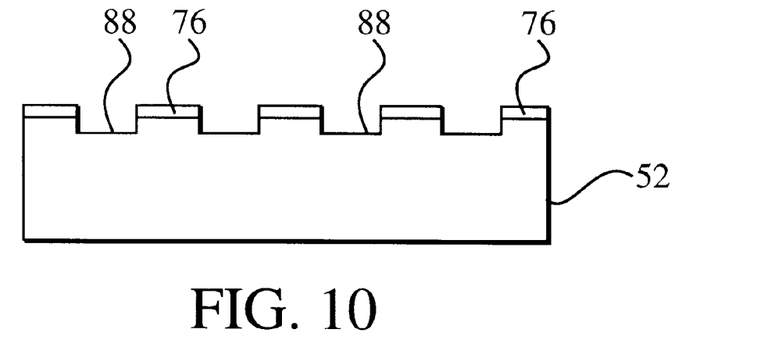
FIG. 10 illustrates a reticle undergoing an intermediate stage of processing according to the present invention at a point subsequent to that shown in FIG. 9.
Figure 11:
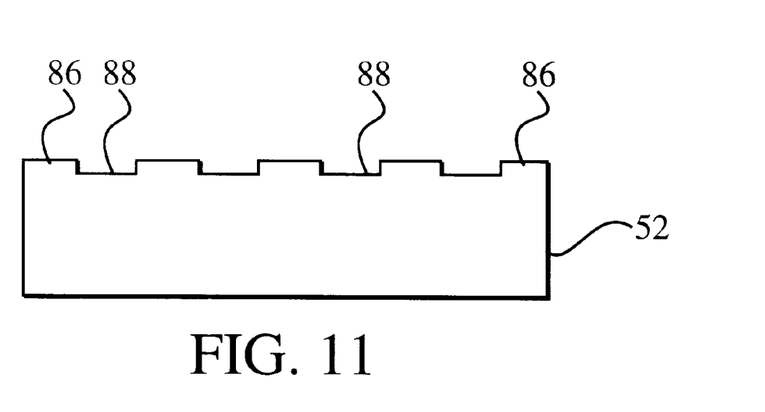
FIG. 11 illustrates a reticle undergoing an intermediate stage of processing according to the present invention at a point subsequent to that shown in FIG. 10.

Next, the structure of FIG. 8 is placed in a high density plasma etcher and etched into the quartz to the desired depth to obtain 180-degree phase shift regions 88, as shown in FIG. 9. Areas 66, containing the remaining pattern layer 55, are written and developed during a process step generally known as the "second write." At the end of the second write, remaining resist layer of areas 66 is removed and the structure of FIG. 10 is obtained. Next, remaining portions 76 (FIG. 10) of chrome layer 54 are etched off, producing 0-degree phase shift regions 86 and 180-degree phase shift regions 88 on reticle substrate 52, as illustrated in FIG. 11. Each of the 0-degree phase shift regions 86 is bounded by 180-degree phase shift regions 88, and each of the 180-degree phase shift regions 88 is bounded by 0-degree phase shift regions 86.

The reticle of FIG. 11 can now be used to produce finely spaced features, such as capacitor wells, in an insulating layer of a semiconductor device.

Although exemplary embodiments of the present invention have been described, it is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A reticle for use in semiconductor device fabrication, said reticle comprising:

a substrate having triangular light transmissive regions of thereon, at least one of said light transmissive regions providing a substantially zero-phase shift for light passing therethrough, said at least one light transmissive region having side edges, each of said side edges of said at least one light transmissive region having an abutting light transmissive region which provides a phase shift for light passing therethrough.

2. The reticle of claim 1, wherein said abutting light transmissive region is a 180-degree phase shift region.

3. The reticle of claim 2, wherein said 180-degree phase shift region has side edges, each of said side edges having an abutting substantially zero-phase shift region.

4. The reticle of claim 1, wherein said substrate is formed of a material selected from the group consisting of quartz, silica glass, and borosilicate glass.

5. The reticle of claim 1, wherein at least some of said light transmissive regions are partially light transmissive.

6. A method for forming a reticle for use in semiconductor device fabrication, comprising:

providing a reticle substrate;

forming at least a partially light transmissive layer thereon;

forming a pattern layer on said partially light transmissive layer;

patterning said pattern layer with a predetermined pattern, which can be used to etch said reticle substrate to form at least one triangular light transmissive region providing a substantially zero-phase shift for light passing therethrough, said at least one light transmissive region having side edges, each of the side edges of said at least one light transmissive regions having an abutting light transmissive region which provides a phase shift for light passing therethrough; and etching said substrate through said pattern layer.

7. The method of claim 6, wherein said abutting light transmissive region is about 180-degree phase shift region.

8. The method of claim 6, wherein at least some of said light transmissive regions are partially light transmissive.

9. The method of claim 6, wherein said reticle is formed of a material selected from the group consisting of quartz, silica glass, and borosilicate glass.

10. A method for forming a reticle for use in semiconductor device fabrication, comprising:

providing a reticle substrate;

forming a chrome layer thereon;

forming a pattern layer on said chrome layer;

patterning said pattern layer with a predetermined pattern, which can be used to etch said reticle substrate to form at least one light transmissive region providing a substantially zero-phase shift for light passing therethrough, said at least one light transmissive region having side edges, each of the side edges of said at least one light transmissive region having an abutting light transmissive region which provides a phase shift for light passing therethrough; and etching said reticle substrate through said pattern layer.

11. The method of claim 10, wherein said abutting light transmissive region is about 180-degree phase shift region.

12. The method of claim 10, wherein at least some of said light transmissive regions are partially light transmissive.

13. The method of claim 10, wherein said light transmissive regions are triangular regions.

14. The method of claim 10, wherein said light transmissive regions are rectangular regions.

15. The method of claim 10, wherein said reticle is formed of a material selected from the group consisting of quartz, silica glass, and borosilicate glass.

* * * * *